(12) United States Patent
Takagi

(10) Patent No.: US 8,817,162 B2
(45) Date of Patent: Aug. 26, 2014

(54) SOLID-STATE IMAGING DEVICE WITH OPTICAL WAVEGUIDE AND BLOCKING MEMBER

(75) Inventor: Akinari Takagi, Yokosuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 299 days.

(21) Appl. No.: 13/073,152

(22) Filed: Mar. 28, 2011

(65) Prior Publication Data

US 2011/0249161 A1 Oct. 13, 2011

(30) Foreign Application Priority Data

Apr. 12, 2010 (JP) ................. 2010-091514

(51) Int. Cl.
  *H04N 5/225* (2006.01)
  *H04N 5/335* (2011.01)
  *H01L 27/146* (2006.01)
  *G02B 7/28* (2006.01)

(52) U.S. Cl.
  CPC .... H01L 27/14629 (2013.01); H01L 27/14625 (2013.01); H01L 27/14623 (2013.01); G02B 7/28 (2013.01)
  USPC .......................................... 348/340; 348/294

(58) Field of Classification Search
  USPC ............... 348/335, 340, 345, 348; 250/208.1, 250/216, 214.1; 257/290–292
  See application file for complete search history.

(56) References Cited

U.S. PATENT DOCUMENTS

| | | | | |
|---|---|---|---|---|
| 6,829,008 | B1 | 12/2004 | Kondo et al. | 348/302 |
| 7,078,753 | B2 | 7/2006 | Dobashi | 257/294 |
| 7,177,517 | B2 | 2/2007 | Sano et al. | 385/132 |
| 7,615,732 | B2 * | 11/2009 | Tani | 250/216 |
| 7,728,278 | B2 * | 6/2010 | Roy et al. | 250/214.1 |
| 7,732,745 | B2 * | 6/2010 | Naya et al. | 250/208.1 |
| 8,222,705 | B2 * | 7/2012 | Ogino et al. | 257/396 |
| 8,379,084 | B2 * | 2/2013 | Hirai | 348/143 |

(Continued)

FOREIGN PATENT DOCUMENTS

| | | |
|---|---|---|
| CN | 1657987 A | 8/2005 |
| CN | 1830087 A | 9/2006 |

(Continued)

OTHER PUBLICATIONS

Comm. from Chinese Patent Office dated Feb. 16, 2013, in counterpart Chinese Appl'n. No. 2011-10085463.9.

(Continued)

*Primary Examiner* — Tuan Ho
*Assistant Examiner* — Selam Gebriel
(74) *Attorney, Agent, or Firm* — Fitzpatrick, Cella, Harper & Scinto

(57) ABSTRACT

Provided is a solid-state imaging device which can carry out ranging with high precision even when the pixel size is small. The solid-state imaging device including a pixel includes: a photoelectric conversion unit for converting light into an electrical signal; an optical waveguide provided on an light incident side of the photoelectric conversion unit, the optical waveguide being configured so that light entering from a first direction is converted into a first waveguide mode and is guided and light entering from a second direction, which is different from the first direction, is converted into a second waveguide mode and is guided; and a light blocking member provided in the optical waveguide, for reducing more light in the second waveguide mode which is guided to the photoelectric conversion unit than light in the first waveguide mode which is guided to the photoelectric conversion unit.

20 Claims, 13 Drawing Sheets

(56) References Cited

U.S. PATENT DOCUMENTS

| | | |
|---|---|---|
| 8,384,818 B2 | 2/2013 | Hiramoto et al. ............. 348/337 |
| 2005/0072906 A1 | 4/2005 | Dobashi .................... 250/208.1 |
| 2005/0139750 A1 | 6/2005 | Dobashi et al. ............ 250/208.1 |
| 2006/0115230 A1* | 6/2006 | Komoguchi et al. ......... 385/146 |
| 2006/0278948 A1* | 12/2006 | Yamaguchi et al. .......... 257/444 |
| 2007/0280587 A1 | 12/2007 | Makita ............................ 385/14 |
| 2009/0136174 A1* | 5/2009 | Itahashi ........................ 385/14 |
| 2009/0278967 A1* | 11/2009 | Toumiya ...................... 348/294 |
| 2010/0007779 A1* | 1/2010 | Nakata et al. ................ 348/294 |
| 2010/0123811 A1* | 5/2010 | Abe .............................. 348/294 |
| 2010/0194965 A1* | 8/2010 | Yamazaki .................... 348/340 |
| 2010/0201834 A1* | 8/2010 | Maruyama et al. ........ 348/222.1 |
| 2010/0225791 A1* | 9/2010 | Nakayama ................... 348/273 |
| 2010/0230583 A1* | 9/2010 | Nakata et al. .............. 250/227.2 |
| 2010/0301438 A1* | 12/2010 | Ogino et al. ................. 257/432 |
| 2011/0037854 A1* | 2/2011 | Godaiin ....................... 348/164 |
| 2011/0079867 A1 | 4/2011 | Numata et al. ............... 257/432 |
| 2011/0267487 A1* | 11/2011 | Yamagata et al. ......... 348/222.1 |

FOREIGN PATENT DOCUMENTS

| | | |
|---|---|---|
| JP | 7-45805 A | 2/1995 |
| JP | 2000-156823 A | 6/2000 |
| JP | 3592147 B2 | 11/2004 |
| JP | 2005-175233 A | 6/2005 |
| JP | 2005-175234 A | 6/2005 |
| JP | 2005-251804 A | 9/2005 |
| JP | 2005-259824 A | 9/2005 |
| JP | 2005-302884 A | 10/2005 |
| JP | 2006-040948 A | 2/2006 |
| JP | 2006-261249 A | 9/2006 |
| JP | 2006-324439 A | 11/2006 |
| JP | 2007-150592 A | 6/2007 |
| WO | 2009/030980 | 3/2009 |
| WO | 2009/153937 A1 | 12/2009 |

OTHER PUBLICATIONS

Comm. from European Patent Office dated Apr. 8, 2013, in counterpart European Appl'n. No. 11161104.2.

* cited by examiner

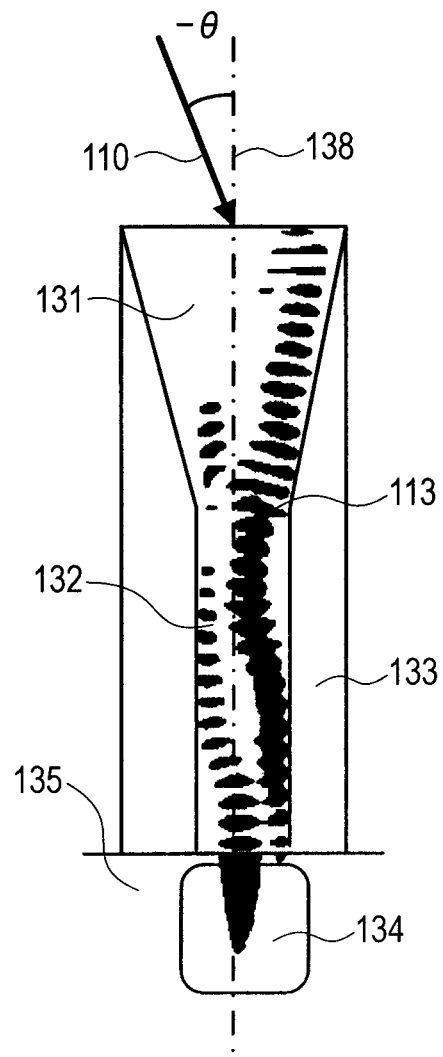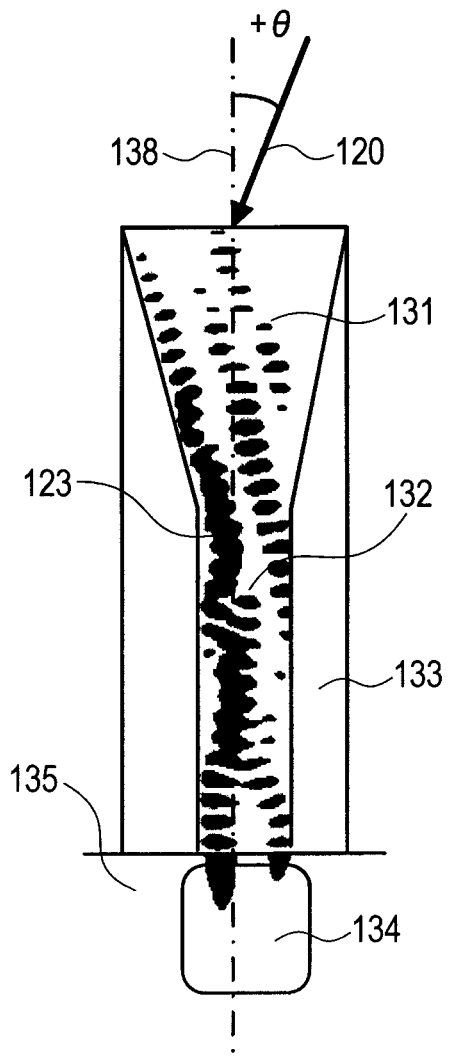

FIG. 13A

| R | G | R | G | R | G | R | G |
|---|---|---|---|---|---|---|---|
| G | 100 | G | 100 | G | 100 | G | 100 |
| 200 | G | 200 | G | 200 | G | 200 | G |
| G | B | G | B | G | B | G | B |

FIG. 13B

| R | G | R | G | R | G | R | G |
|---|---|---|---|---|---|---|---|
| 100 | 200 | 100 | 200 | 100 | 200 | 100 | 200 |
| R | G | R | G | R | G | R | G |

SOLID-STATE IMAGING DEVICE WITH OPTICAL WAVEGUIDE AND BLOCKING MEMBER

BACKGROUND OF THE INVENTION

1. Field of the Invention

The present invention relates to a solid-state imaging device, and more particularly, to a solid-state imaging device for use in a digital still camera, a digital video camera, and the like.

2. Description of the Related Art

In a digital still camera or a video camera, technologies for detecting distances for auto focusing (AF) are known. With regard to such technologies for detecting distances for AF, Japanese Patent No. 3592147 proposes a solid-state imaging device in which a part of pixels of an imaging device have a ranging function and the detection is made by a phase difference system.

The phase difference system is a method in which optical images which pass through different regions on a pupil of a camera lens are compared and triangulation using a stereo image is used to detect the distance.

In such a method, differently from the case of a conventional contrast system, it is not necessary to move the lens in order to carry out ranging, and thus, AF at high speed with high precision is possible. Further, real-time AF when moving images are taken is possible.

In the above-mentioned Japanese Patent No. 3592147, a ranging pixel has between a microlens and a photoelectric conversion unit an opening which is off center with respect to an optical center of the microlens.

This enables selective introduction of light which passes through a predetermined region on the pupil of the camera lens to the photoelectric conversion unit to carry out ranging.

However, in the structure described in Japanese Patent No. 3592147 having the off-center opening, due to light scattering at a wiring member or the like, there is a possibility that light flux can not be separated enough and the ranging precision is lowered.

Further, when the structure described in Japanese Patent No. 3592147 is applied to a solid-state imaging device with a small pixel size, there is a possibility that the following problem arises.

As the pixel size becomes smaller, the F value of the microlens for introducing light to the photoelectric conversion unit becomes larger, and the pixel size and the size of a diffraction image become almost the same.

Therefore, light diverges in the pixel, and thus, there is a possibility that light flux can not be separated enough at the off-center opening and the ranging precision is further lowered.

SUMMARY OF THE INVENTION

The present invention has been made in view of the above-mentioned problem, and an object of the present invention is to provide a solid-state imaging device which can carry out ranging with high precision, and in particular, which can carry out ranging with high precision even when the pixel size is small.

According to the present invention, a solid-state imaging device including a pixel includes: a photoelectric conversion unit for converting light into an electrical signal; an optical waveguide provided on an light incident side of the photoelectric conversion unit, the optical waveguide being configured so that light entering from a first direction is converted into a first waveguide mode and is guided and light entering from a second direction, which is different from the first direction, is converted into a second waveguide mode and is guided; and a light blocking member provided in the optical waveguide, for reducing more light in the second waveguide mode which is guided to the photoelectric conversion unit than light in the first waveguide mode which is guided to the photoelectric conversion unit.

According to the present invention, there can be realized a solid-state imaging device which can carry out ranging with high precision, and in particular, which can carry out ranging with high precision even when the pixel size is small.

Further features of the present invention will become apparent from the following description of exemplary embodiments with reference to the attached drawings.

BRIEF DESCRIPTION OF THE DRAWINGS

FIG. 9A illustrates a waveguide mode when there is no light blocking member in an optical waveguide according to Embodiment 2.

FIG. 9B illustrates another waveguide mode when there is no light blocking member in the optical waveguide according to Embodiment 2.

FIG. 13A illustrates an exemplary arrangement of the ranging pixels in the imaging device according to Embodiment 1.

FIG. 13B illustrates another exemplary arrangement of the ranging pixels in the imaging device according to Embodiment 1.

DESCRIPTION OF THE EMBODIMENTS

Figure 1:
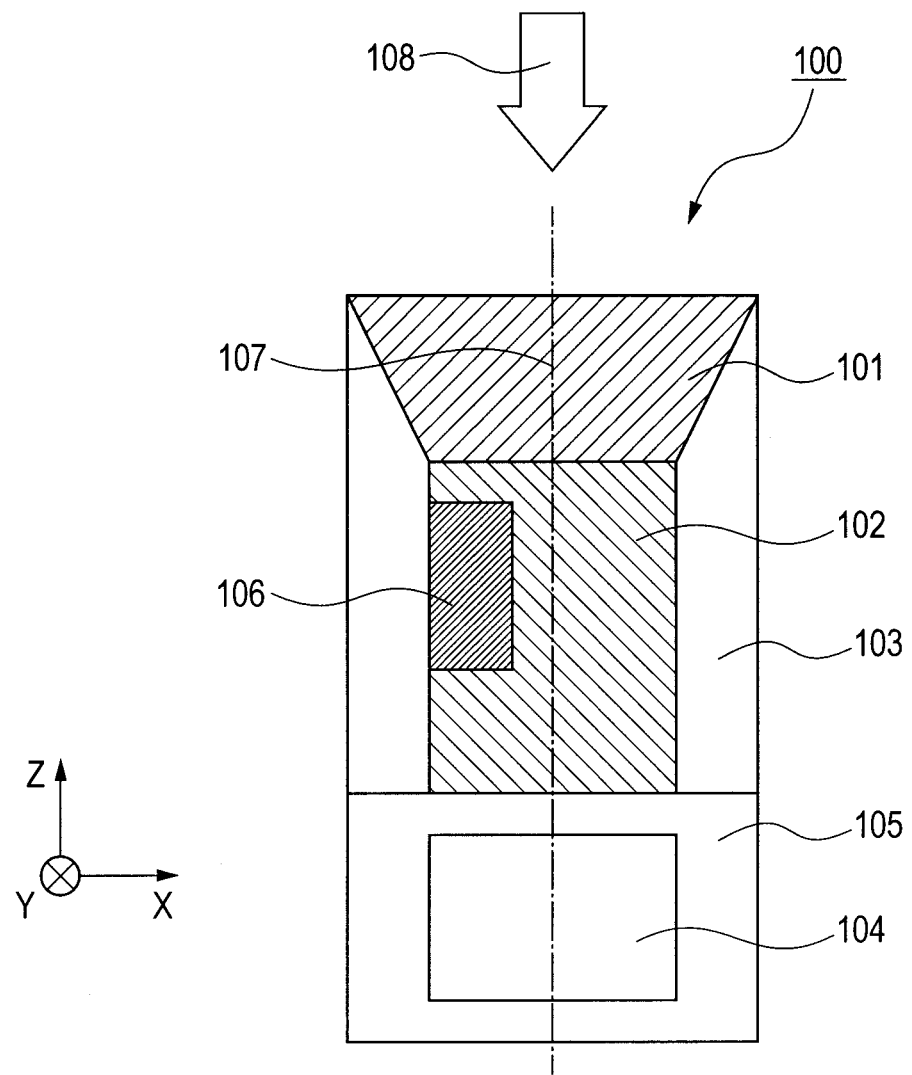
FIG. 1 is a schematic sectional view illustrating a ranging pixel disposed in a part of a solid-state imaging device according to Embodiment 1.

Preferred embodiments of the present invention will now be described in detail in accordance with the accompanying drawings The present invention uses the property that a light propagation state (waveguide mode) in a waveguide varies according to an incident angle of light flux which enters the waveguide.

More specifically, a following solid-state imaging device is materialized. In the solid-state imaging device, a light blocking member is disposed in the waveguide, which enables detection of light which enters at a predetermined angle among the whole incident light, and thus, ranging may be carried out with high precision.

Embodiments of the solid-state imaging device according to the present invention are described in the following with reference to the attached drawings.

Note that, for reference numerals used to designate members having the same functions throughout the figures, repeated description thereof is omitted.

EMBODIMENTS

Embodiment 1

As Embodiment 1, an exemplary structure of a solid-state imaging device according to the present invention is described with reference to FIG. 1.

In FIG. 1, a pixel 100 has a ranging function and is disposed in a part of the solid-state imaging device of this embodiment.

The pixel 100 includes from an light incident side (+z side) an light incident member 101, an optical waveguide (a core member 102 and a clad member 103) having therein a light blocking member 106, and a substrate 105 having therein a photoelectric conversion unit 104.

The light blocking member 106 is disposed so as to be asymmetrical with respect to an yz plane including a central axis 107 of the optical waveguide. Here, the central axis 107 of the optical waveguide is a central axis of the core member 102.

The light incident member 101, the core member 102, and the clad member 103 are formed of a transparent material in a wavelength band in the imaging, such as $SiO_2$, SiN, or an organic material.

Note that, the light incident member 101 and the core member 102 are formed of a material having the refractive index of which is higher than that of the clad member 103.

This enables confinement of light in the light incident member 101 and the core member 102 to be propagated.

The light incident member 101 is shaped so that the diameter thereof becomes gradually larger toward the light incident side, that is, in a tapered shape. This enables efficient introduction of light flux incident on the pixel 100 to the core member 102.

The substrate 105 is formed of a material which absorbs light in the wavelength band in the imaging, for example, Si, and includes the photoelectric conversion unit 104 formed therein by ion implantation or the like.

The light blocking member 106 is formed of a material which is opaque to light in the wavelength band in the imaging, for example, a metal such as Al or Cu.

Light flux 108 which has entered the pixel 100 from the outside enters the optical waveguide via the light incident member 101, is converted into a waveguide mode, propagates through the optical waveguide, and is introduced to the photoelectric conversion unit 104.

The light flux which enters the photoelectric conversion unit 104 is converted in an electron, and an electrical signal according to the incident light intensity is output to a signal processing circuit (not shown).

A waveguide mode is expressed by the sum of multiple eigenmodes of the optical waveguide and indicates a state of propagation through the optical waveguide. The eigenmode is uniquely determined by the shapes and the refractive indices of the core member and the clad member of the optical waveguide.

Figure 2A:
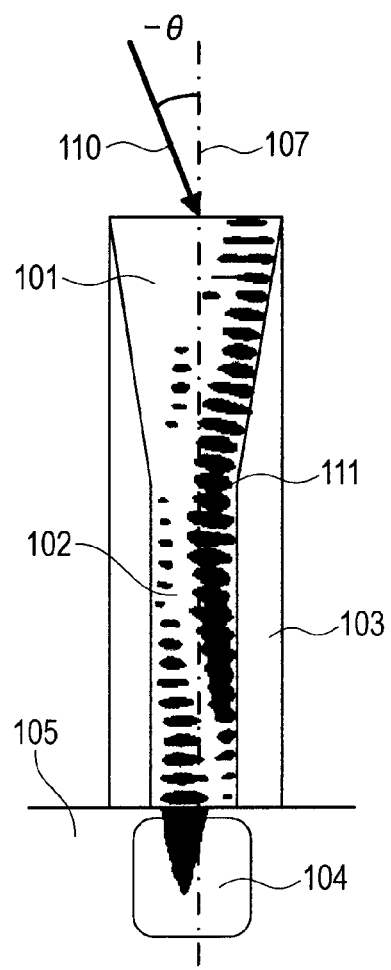
FIG. 2A illustrates a waveguide mode when there is no light blocking member in an optical waveguide according to Embodiment 1.
Figure 2B:
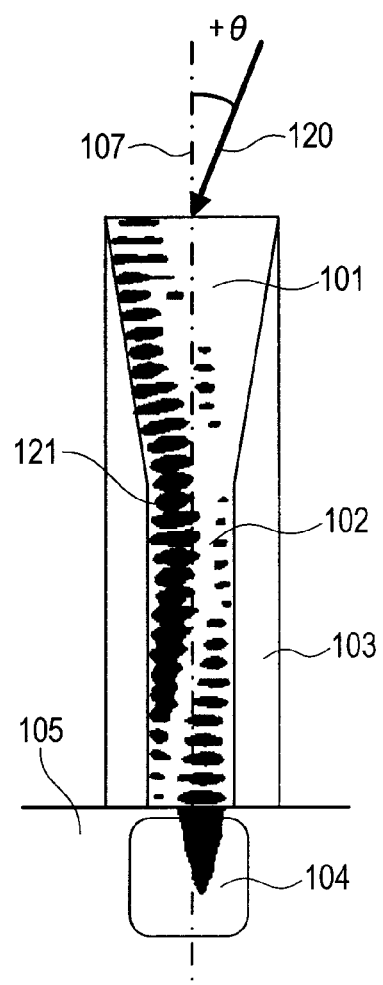
FIG. 2B illustrates another waveguide mode when there is no light blocking member in the optical waveguide according to Embodiment 1.

FIGS. 2A and 2B illustrate waveguide modes when the light blocking member 106 is not included in the optical waveguide.

FIG. 2A illustrates an electric field intensity distribution in a first waveguide mode 111 of light flux 110 which enters at an angle −θ (from a first direction) while FIG. 2B illustrates an electric field intensity distribution in a second waveguide mode 121 of light flux 120 which enters at an angle +θ (from a second direction).

In this way, the waveguide mode in the optical waveguide varies depending on the incident angle.

Figure 3A:
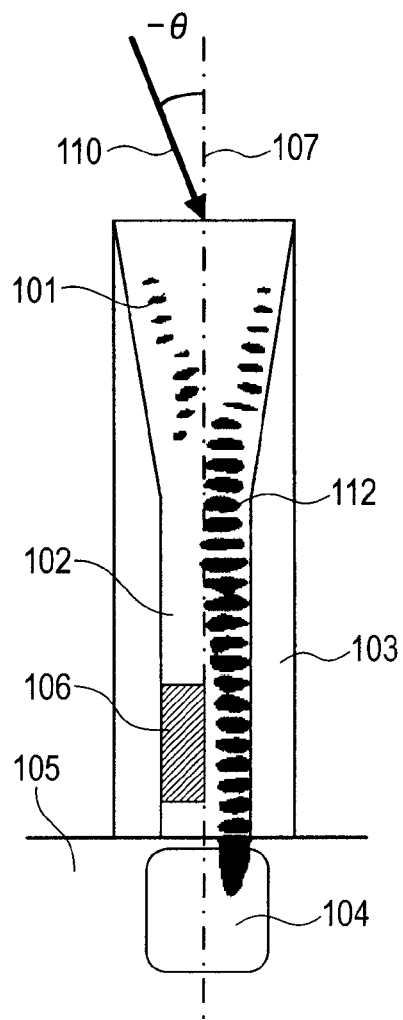
FIG. 3A illustrates a waveguide mode in the optical waveguide when a light blocking member is disposed in the optical waveguide according to Embodiment 1.
Figure 3B:
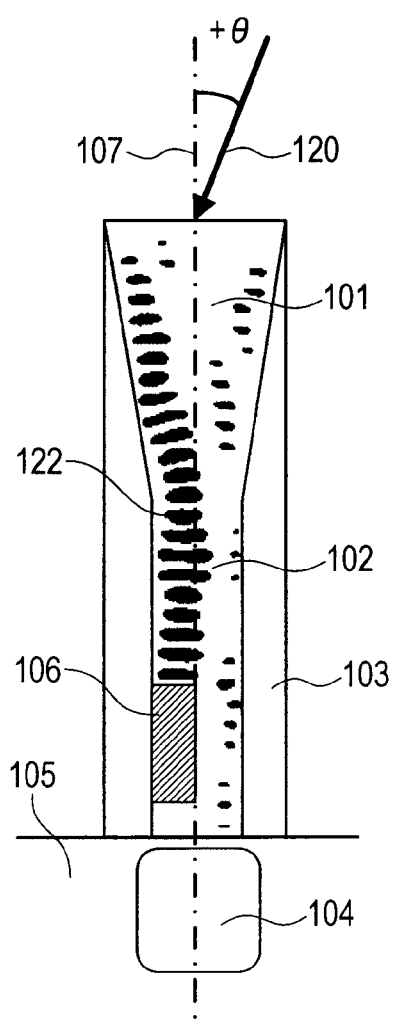
FIG. 3B illustrates another waveguide mode in the optical waveguide when the light blocking member is disposed in the optical waveguide according to Embodiment 1.

FIGS. 3A and 3B illustrate waveguide modes when the light blocking member 106 is disposed in the optical waveguide.

FIG. 3A illustrates an electric field intensity distribution in a first waveguide mode 112 of the light flux 110 which enters at the angle −θ (from the first direction) while FIG. 3B illustrates an electric field intensity distribution in a second waveguide mode 122 of the light flux 120 which enters at the angle +θ (from the second direction).

As illustrated in FIG. 3A, the light flux 110 which enters from the first direction is converted into the first waveguide mode 112, is guided through the optical waveguide, and is introduced to the photoelectric conversion unit 104 without being affected by the light blocking member 106.

On the other hand, as illustrated in FIG. 3B, the light flux 120 which enters from the second direction is converted into the second waveguide mode 122, is guided through the optical waveguide, is blocked by the light blocking member 106, and does not reach the photoelectric conversion unit 104.

Figure 4:
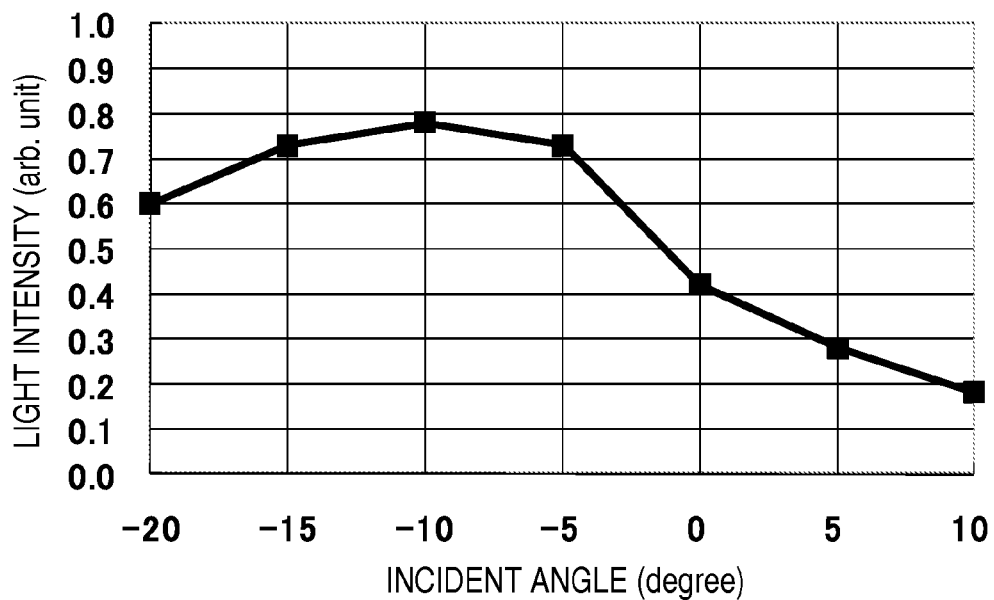
FIG. 4 is a graph illustrating dependence of detected light intensity on incident angle in the pixel according to Embodiment 1.

FIG. 4 is a graph illustrating dependence of detected light intensity on incident angle in the pixel 100. It can be confirmed that more light may be detected when the light is incident at the angle −θ (from the first direction) compared with the case where the light is incident at the angle +θ (from the second direction).

As described above, by disposing the light blocking member 106 in the optical waveguide, the light which enters from the second direction which is different from the first direction and which is guided to the photoelectric conversion unit is reduced more than the light which enters from the first direction and which is guided to the photoelectric conversion unit. This enables detection of light which enters at a predetermined angle.

Note that, in the above description, the angle −θ is defined as the first direction and the angle +θ is defined as the second direction, but it is enough that the first direction and the second direction are defined as different directions. For example, the angle −θ may be defined as the second direction while the angle +θ may be defined as the first direction. Further, the angle in the first direction and the angle in the second direction are not necessarily required to be symmetrical with the central axis 107, and signs of the angles of those directions are not necessarily required to be of opposite signs.

Next, a method of measuring the distance to a subject using the imaging device according to this embodiment is described with reference to FIGS. 5A to 5C.

Figure 5A:
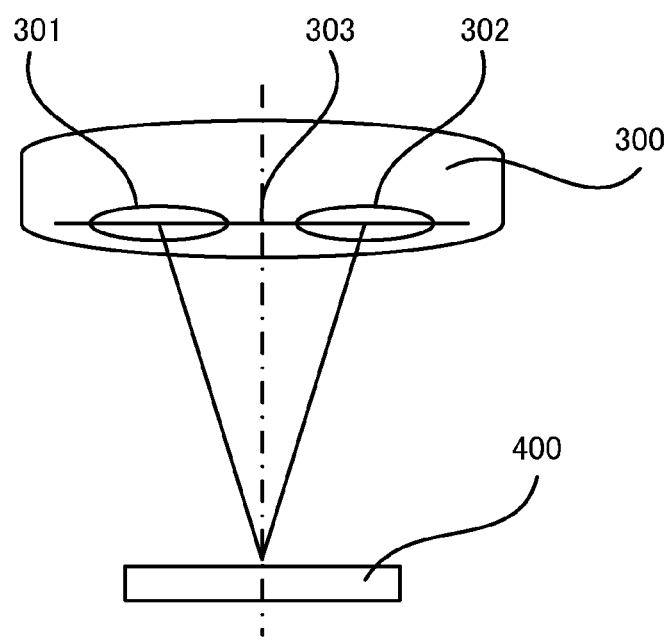
FIG. 5A is an explanatory view of a method of measuring the distance to a subject using the imaging device according to Embodiment 1.

As illustrated in FIG. 5A, an image-forming lens 300 forms an image of an outside world onto a plane of an imaging device 400.

Figure 5B:
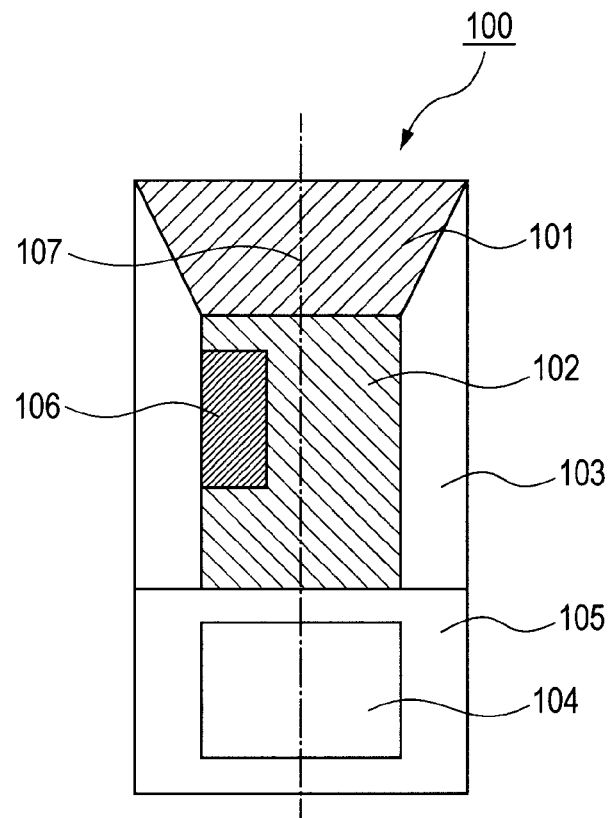
FIG. 5B is another explanatory view of the method of measuring the distance to the subject using the imaging device according to Embodiment 1.
Figure 5C:
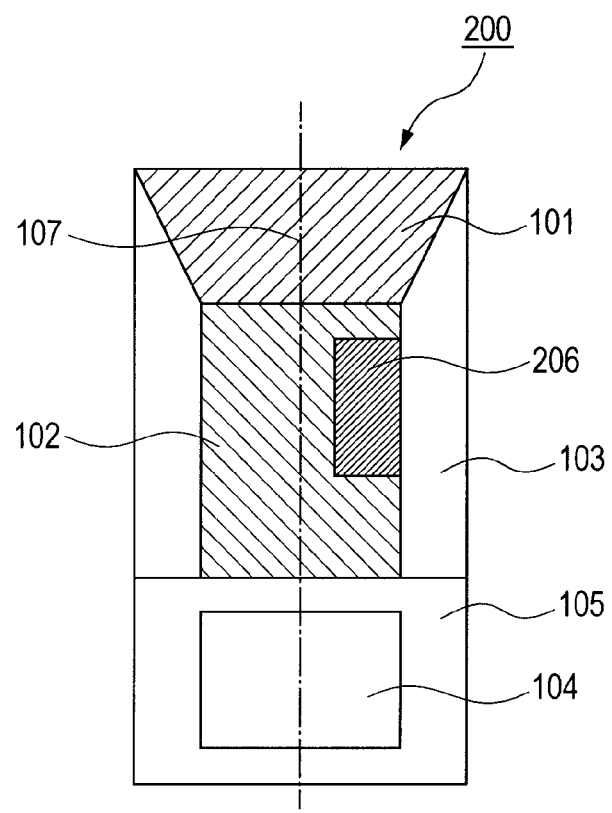
FIG. 5C is yet another explanatory view of the method of measuring the distance to the subject using the imaging device according to Embodiment 1.

The imaging device 400 has a first pixel region including multiple pixels (first pixels) 100 illustrated in FIGS. 1 and 5B for detecting light which enters from the first direction. The imaging device 400 also has a second pixel region including multiple pixels (second pixels) 200 illustrated in FIG. 5C for detecting light which enters from the second direction. In the pixel 200, a light blocking member 206 is disposed so as to be symmetrical with the light blocking member 106 of the pixel 100 illustrated in FIG. 5B with respect to the yz plane including the central axis 107 of the optical waveguide.

The distance between the image-forming lens 300 and the imaging device 400 is large for the size of the pixels. Therefore, light fluxes which pass through different regions on an exit pupil of the image-forming lens 300 are incident on the imaging device 400 as light fluxes at different incident angles.

In the pixels 100 in the first pixel region, light flux which passes through a region 301 (first exit pupil region) which substantially corresponds to the first direction of the exit pupil of the image-forming lens 300 (exit pupil of an optical system which forms a subject image) is detected.

Similarly, in the pixels 200 in the second pixel region, light flux which passes through a region 302 (second exit pupil region) which substantially corresponds to the second direction of the exit pupil of the image-forming lens 300 is detected.

Therefore, optical images which pass through different regions on the exit pupil of the image-forming lens may be detected, and a pixel signal from the first pixel region and a pixel signal from the second pixel region are compared. A subject ranging signal may be created therefrom and may be output to detect the distance to the subject.

FIGS. 13A and 13B illustrate exemplary arrangements of the first pixels 100 and the second pixels 200 in the imaging device. As illustrated in FIG. 13A, a line including the first pixels 100 (first pixel regions) and a line including the second pixels 200 (second pixel regions) may be arranged side by side in an ordinary Bayer array imaging device.

When a camera lens which forms an image on the imaging device is in focus, an image signal from the first pixel regions and an image signal from the second pixel regions are the same. If the camera lens is focused on a place in front of or at the back of an imaging plane of the imaging device, a phase difference is caused between an image signal from the first pixel regions and an image signal from the second pixel regions. The direction of the phase shift when the focus is on a plane in front of the imaging plane is opposite to that of when the focus is on a plane at the back of the imaging plane. Based on the phase difference and the direction of the phase shift, the distance to the subject may be detected.

Further, as illustrated in FIG. 13B, the first pixel regions 100 and the second pixel regions 200 may be arranged in one line or in lines in proximity to each other.

Note that, in order to detect the distance with high precision irrespective of the distance to and the location of the subject, it is desired that the first exit pupil region 301 and the second exit pupil region 302 be set so as to be symmetrical with respect to a center 303 of the exit pupil.

Therefore, the first direction and the second direction are defined with respect to a main light beam, which is a light beam passes through the center 303 of the exit pupil and enters the imaging device.

More specifically, when the main light beam enters the plane of the imaging device in a oblique direction, the first direction and the second direction are respectively defined so as to form an equal angle with the incident angle of the oblique main light beam in opposite directions. By determining the shape and the location of the light blocking member based on a spatial distribution of the waveguide mode according to the incident angle, necessary dependence of detected light intensity on incident angle may be materialized. When the position of the exit pupil of the image-forming lens is at a finite distance from the plane of the imaging device and the incident angle of the main light beam varies depending on the field of view, the shape and the location of the light blocking member in a pixel may be changed within the plane of the imaging device according to the amount of change in the incident angle.

Further, a color filter for limiting the wavelength band of light which enters the pixel 100 may be provided on the light incident side.

This may make smaller the effect of change in the waveguide mode due to the wavelength, and thus, the angle selectivity of the detected light intensity may be improved, and the precision of detecting the distance may be made higher.

The color filter is formed of a material which transmits light in a predetermined wavelength band and which absorbs, reflects, or scatters light in other wavelength bands, and, for example, an organic material or an inorganic material is used to form the color filter.

Figure 6:
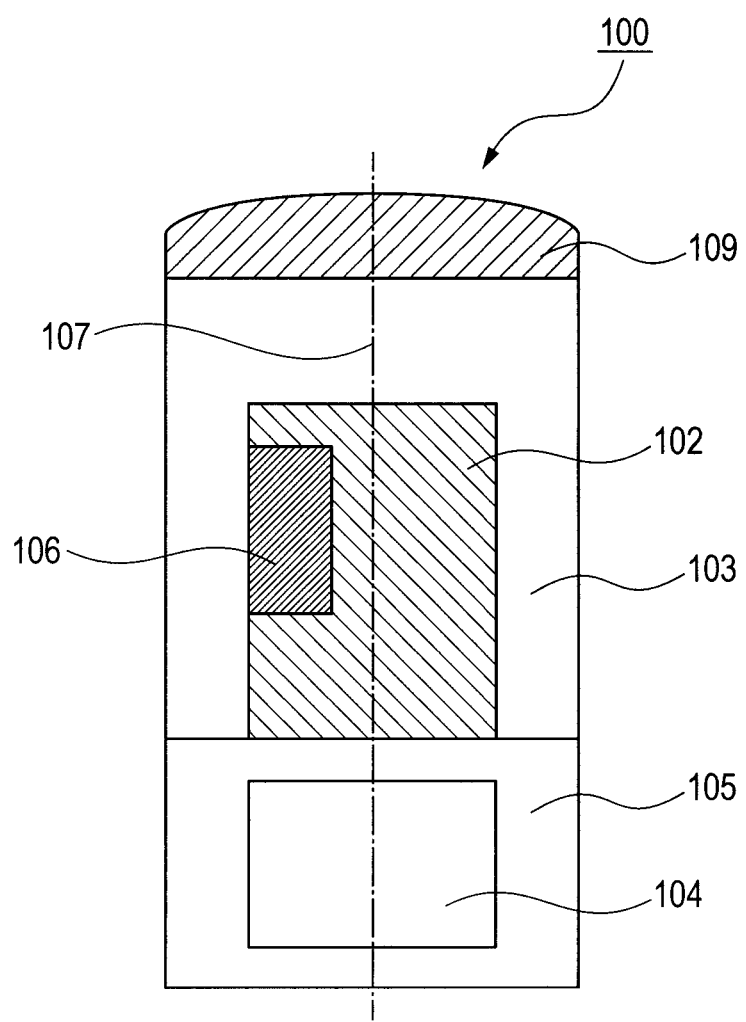
FIG. 6 illustrates an exemplary structure formed using a microlens on an light incident side of the optical waveguide according to Embodiment 1.

Further, as illustrated in FIG. 6, the color filter may be formed by use of a microlens 109 on the light incident side of the optical waveguide.

Further, light which propagates through the optical waveguide passes through not only the core member 102 but also a part of the clad member 103. Therefore, the light blocking member 106 may be disposed not only in the core member 102 but also in a part of the clad member 103.

As described above, by disposing the light blocking member 106 so as to be asymmetrical with respect to the yz plane including the central axis 107 of the optical waveguide, light which enters at a predetermined angle may be detected, and a solid-state imaging device which can carry out ranging with high precision may be materialized.

FIGS. 7A to 7E are used to describe manufacturing process steps of the solid-state imaging device including the pixel 100 according to this embodiment.

Figure 7A:
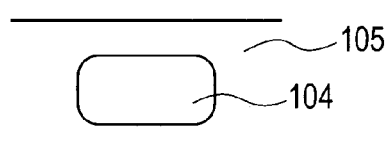
FIG. 7A is an explanatory view of a manufacturing process step of the solid-state imaging device including the pixel according to Embodiment 1.

First, ions are implanted at a predetermined location of the substrate 105 formed of silicon to form the photoelectric conversion unit 104. After wiring and the like (not shown) are formed, the substrate is made to be a thin film by CMP, etch back, or the like from a rear side (FIG. 7A).

Figure 7D:
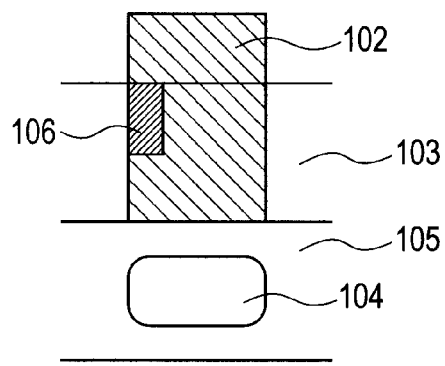
FIG. 7D is an explanatory view of a manufacturing process step of the solid-state imaging device including the pixel according to Embodiment 1.
Figure 7B:
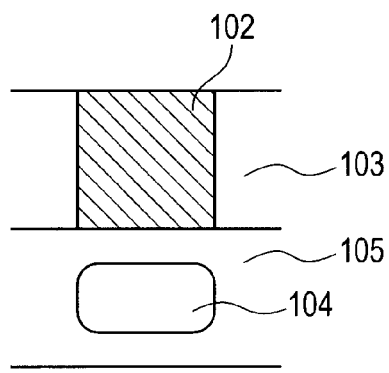
FIG. 7B is an explanatory view of a manufacturing process step of the solid-state imaging device including the pixel according to Embodiment 1.

Then, a SiN film is formed, the core member 102 is formed by photolithography, lift-off, and the like, an SOG film is formed, and flattening is carried out by CMP, etch back, or the like, to thereby form the clad member 103 (FIG. 7B).

Figure 7E:
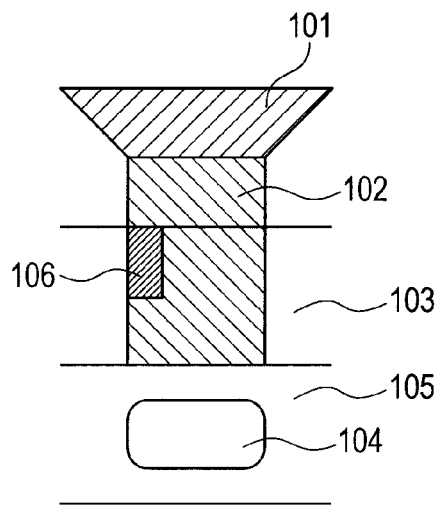
FIG. 7E is an explanatory view of a manufacturing process step of the solid-state imaging device including the pixel according to Embodiment 1.
Figure 7C:
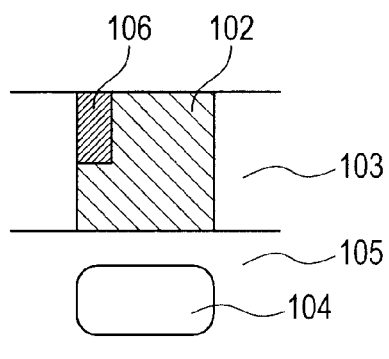
FIG. 7C is an explanatory view of a manufacturing process step of the solid-state imaging device including the pixel according to Embodiment 1.

Then, a recessed portion is formed at a predetermined location of the core member by photolithography and etching, and Al is embedded therein, to thereby form the light blocking member 106 (FIG. 7C).

Further, a SiN film is formed and the core member 102 is formed by photolithography, lift-off, or the like (FIG. 7D).

After the SOG film is formed and flattening is carried out to form the clad member 103, a recessed portion is formed by photolithography and etching. By embedding SiN therein, the light incident member 101 is formed. In this way, the pixel 100 may be formed (FIG. 7E).

Embodiment 2

As Embodiment 2, another exemplary structure of a solid-state imaging device according to the present invention is described with reference to FIG. 8.

Figure 8:
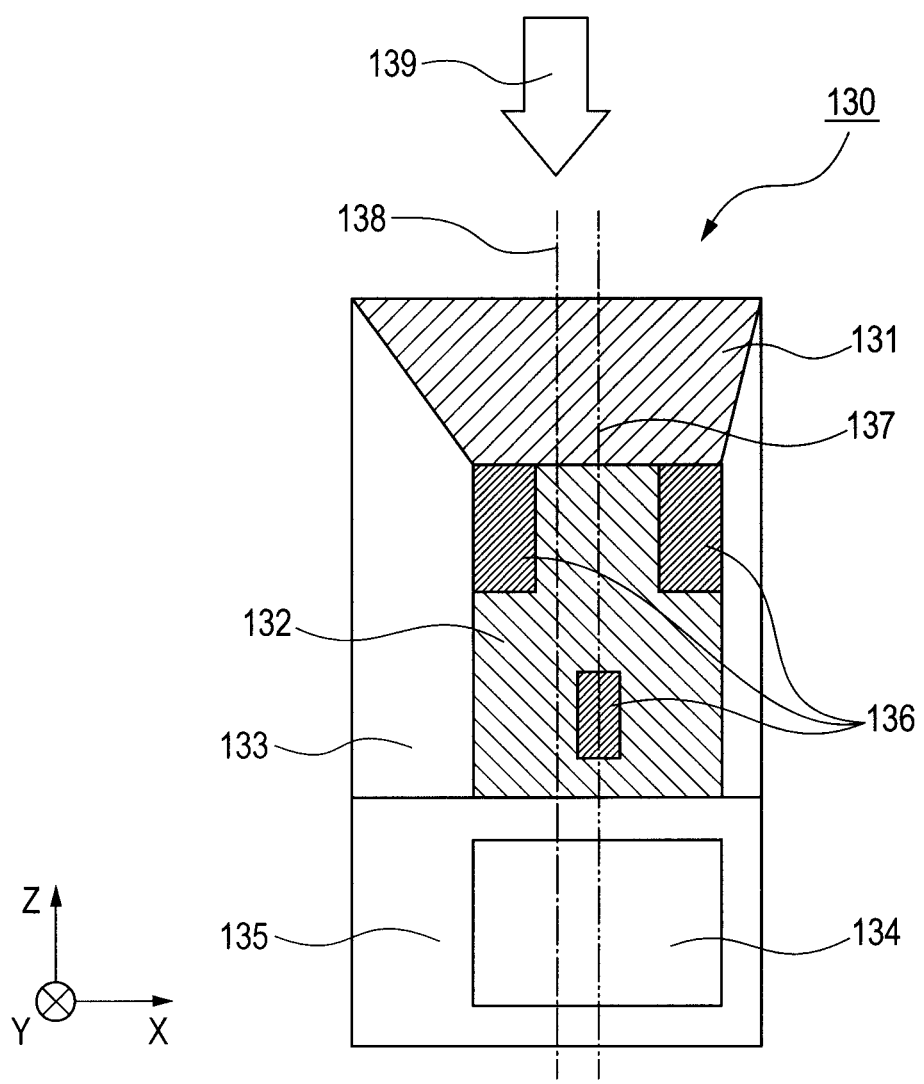
FIG. 8 is a schematic sectional view illustrating a ranging pixel disposed in a part of a solid-state imaging device according to Embodiment 2.

In FIG. 8, a ranging pixel 130 is disposed in a part of the solid-state imaging device of this embodiment.

The pixel 130 includes from an light incident side (+z side) an light incident member 131, an optical waveguide (a core member 132 and a clad member 133) including therein light blocking members 136, and a substrate 135 including therein a photoelectric conversion unit 134.

A central axis 137 of the optical waveguide is shifted with respect to a central axis 138 of the pixel 130 in an xz plane. The light blocking members 136 are disposed so as to be symmetrical with respect to an yz plane including the central axis 137 of the optical waveguide.

The light incident member 131 is shaped so that the diameter thereof becomes gradually larger toward the light incident side, that is, in a tapered shape.

Further, a central axis of the light incident member 131 on the light incident side is coincident with the central axis 138 of the pixel 130 while the central axis of the light incident member 131 on an optical exit side is coincident with the central axis 137 of the optical waveguide. In this way, the light incident member 131 is in a tapered shape which is asymmetrical with respect to the yz plane including the central axis 137 of the optical waveguide. This enables efficient introduction of light flux incident on the pixel 130 to the core member 132.

Light flux 139 which has entered the pixel 130 from the outside enters the optical waveguide via the light incident member 131, is converted into a waveguide mode, propagates through the optical waveguide, and is introduced to the photoelectric conversion unit 134.

The light flux which enters the photoelectric conversion unit 134 is converted into an electron, and an electrical signal according to the incident light intensity is output to a signal processing circuit (not shown).

FIGS. 9A and 9B illustrate waveguide modes when the light blocking member 136 is not included in the optical waveguide.

FIG. 9A illustrates an electric field intensity distribution in a first waveguide mode 113 of light flux 110 which enters at an angle −θ (from a first direction) while FIG. 9B illustrates an electric field intensity distribution in a second waveguide mode 123 of light flux 120 which enters at an angle +θ (from a second direction).

In this way, the waveguide mode in the optical waveguide varies depending on the incident angle.

Figure 10A:
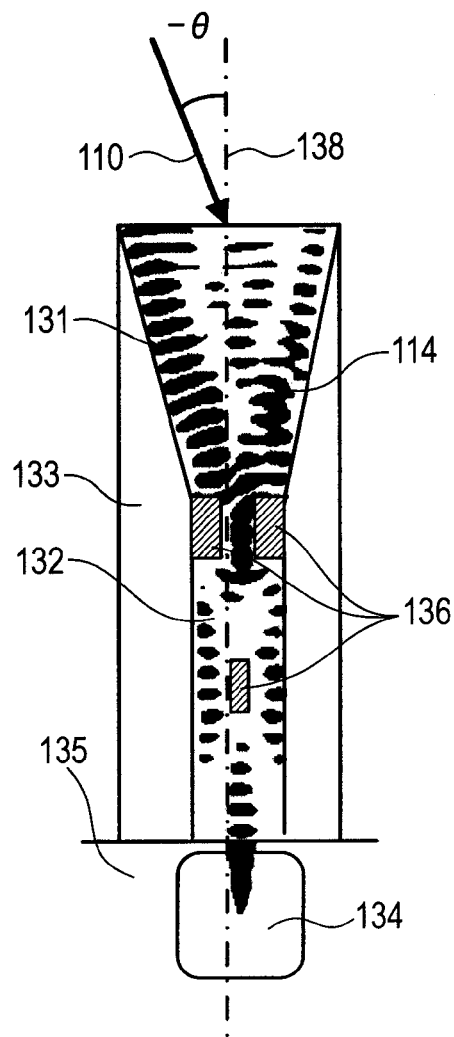
FIG. 10A illustrates a waveguide mode in the optical waveguide when a light blocking member is disposed in the optical waveguide according to Embodiment 2.
Figure 10B:
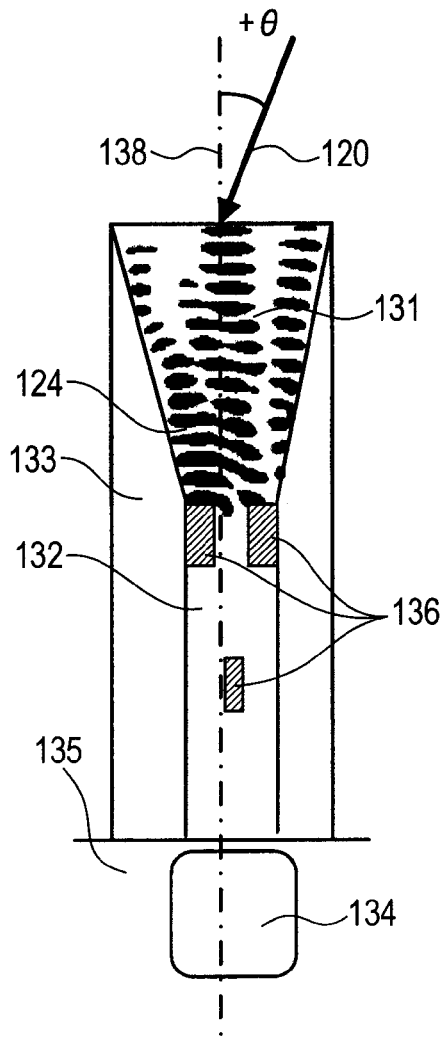
FIG. 10B illustrates another waveguide mode in the optical waveguide when the light blocking member is disposed in the optical waveguide according to Embodiment 2.

Waveguide modes when the light blocking member 136 is disposed in the optical waveguide are illustrated in FIGS. 10A and 10B.

FIGS. 10A and 10B illustrate electric field intensity distributions in waveguide modes of light flux which enter from predetermined directions.

FIG. 10A illustrates an electric field intensity distribution in a first waveguide mode 114 of the light flux 110 which enters at the angle −θ (from the first direction) while FIG. 10B illustrates an electric field intensity distribution in a second waveguide mode 124 of the light flux 120 which enters at the angle +θ (from the second direction).

As illustrated in FIG. 10A, the light flux 110 which enters from the first direction is converted into the first waveguide mode 114, is guided through the optical waveguide, and is introduced to the photoelectric conversion unit 134 without being affected by the light blocking member 136.

On the other hand, as illustrated in FIG. 10B, the light flux 120 which enters from the second direction is converted into the second waveguide mode 124, is guided through the optical waveguide, is blocked by the light blocking member 136, and does not reach the photoelectric conversion unit 134.

Figure 11:
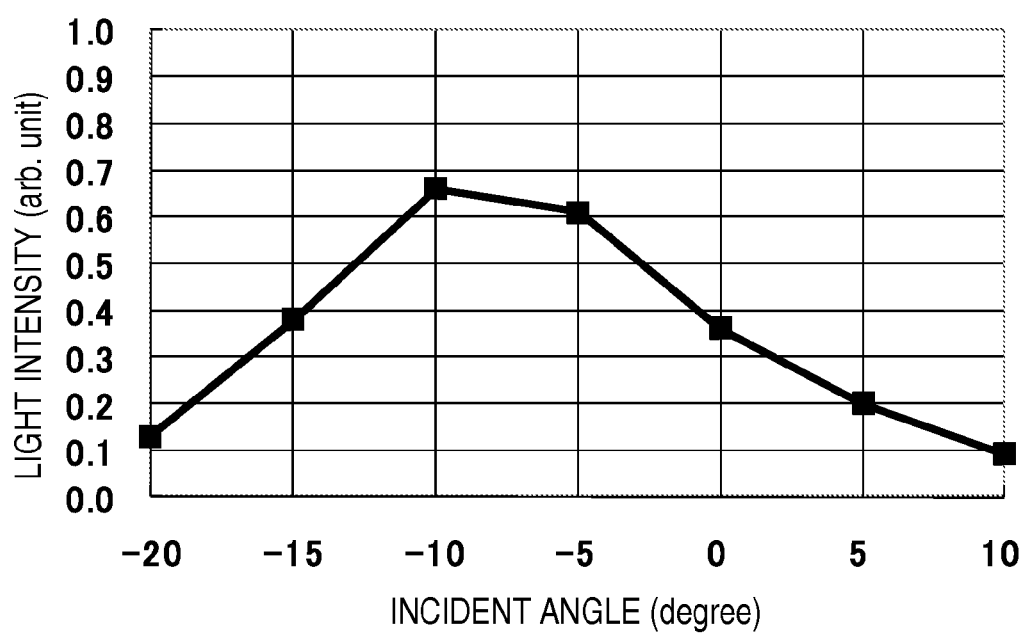
FIG. 11 is a graph illustrating dependence of detected light intensity on incident angle in a pixel according to Embodiment 2.

FIG. 11 is a graph illustrating dependence of detected light intensity on incident angle in the pixel 130. It can be confirmed that more light may be detected when the light is incident at the angle −θ (from the first direction) compared with the case where the light is incident at the angle +θ (from the second direction).

As described above, by disposing the light blocking members in regions through which a waveguide mode corresponding to an incident angle to be blocked passes and through which a waveguide mode corresponding to an incident angle to be guided does not pass, light which enters at a predetermined angle may be detected.

As described above, by shifting the central axis 137 of the optical waveguide with respect to the central axis 138 of the pixel and disposing the light blocking members 136 so as to be symmetrical with respect to the yz plane including the central axis 137 of the optical waveguide, the light which enters at a predetermined angle may be detected.

A first pixel region in which multiple pixels 130 for detecting light entering from the first direction and a second pixel region in which multiple pixels for detecting light entering from the second direction are provided in an imaging device.

Similarly to the case of Embodiment 1, this enables detection of the distance to the subject with high precision. Note that, the latter pixel is symmetrical with respect to the yz plane including the central axis 138 of the pixel with reference to the pixel 130 illustrated in FIG. 8.

More specifically, with regard to the latter pixel, the central axis 137 of the optical waveguide is shifted to the opposite side with respect to the central axis 138 of the pixel. The locations of the light blocking members with respect to the central axis of the optical waveguide are the same as those in the pixel 130.

In this embodiment, the incident angle at which the detected light intensity becomes the highest may be determined by the amount of the shift of the central axis of the optical waveguide with respect to the central axis of the pixel.

Further, the amount of change in the detected light intensity according to the incident angle may be determined by the shapes and the locations of the light blocking members.

As described in the above, compared with the case of Embodiment 1, design flexibility may be increased and detection of distances with higher precision is made possible.

Further, similarly to the case of Embodiment 1, the amount of the shift of the central axis of the optical waveguide may be changed with respect to the incident angle of the main light beam within the plane of the imaging device.

Figure 12A:
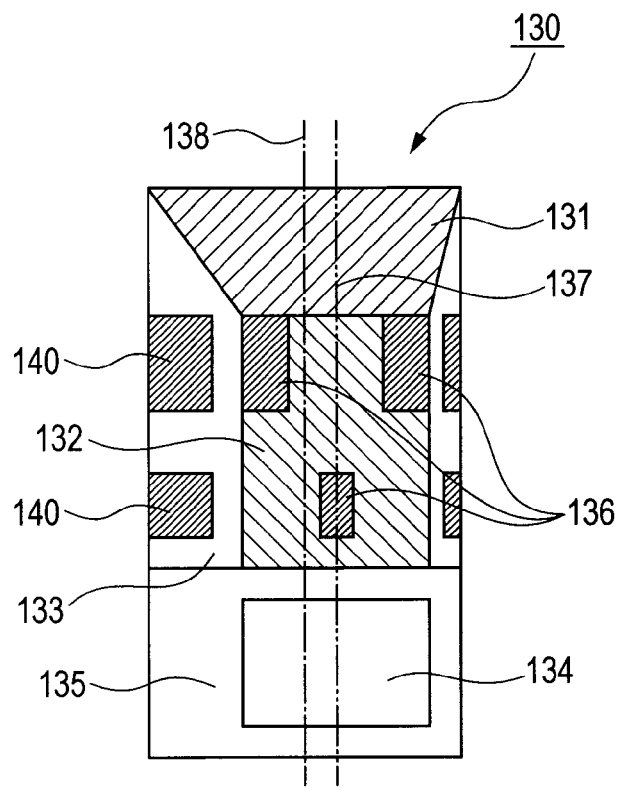
FIG. 12A illustrates an example in which a wiring member is formed in a clad member according to Embodiment 2.

Further, as illustrated in FIG. 12A, a wiring member 140 may be formed in the clad member 133. Here, if the material of the light blocking member 136 is the same as that of the wiring member 140, the number of kinds of materials used may be reduced to facilitate the manufacture. If the light blocking member 136 is level with the wiring member 140, the light blocking member 136 and the wiring member 140 may be formed at the same time, which further facilitates the manufacture, and thus, is desired.

Figure 12B:
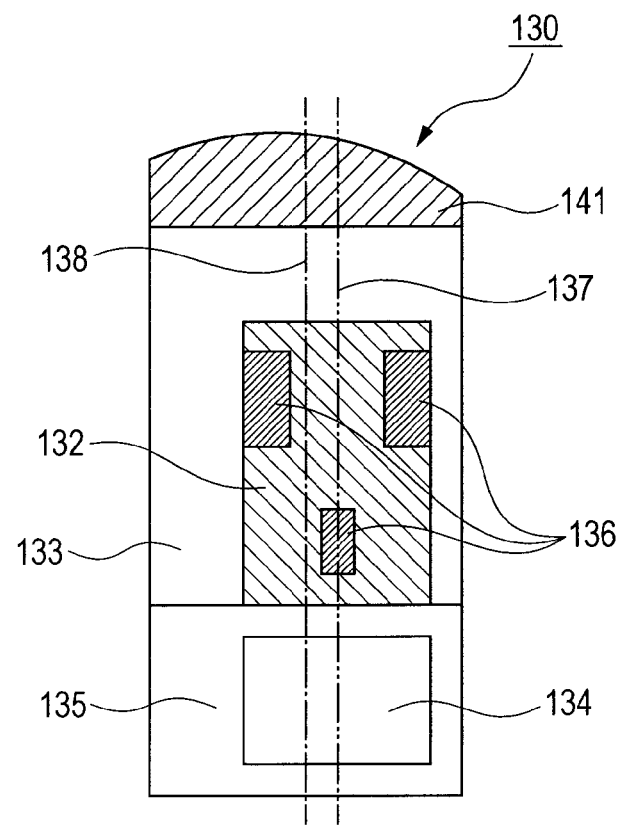
FIG. 12B illustrates an example in which a microlens is provided on an light incident side of the optical waveguide according to Embodiment 2.

Further, as illustrated in FIG. 12B, a microlens 141 may be provided on the light incident side of the optical waveguide.

Here, if the microlens 141 is disposed with a center thereof being shifted with respect to the central axis 138 of the pixel, light flux incident on the pixel 130 may be efficiently introduced to the optical waveguide.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-091514, filed Apr. 12, 2010, which is hereby incorporated by reference herein in its entirety.

What is claimed is:

1. A solid-state imaging device comprising a pixel comprising:
   a photoelectric conversion unit for converting light of a wavelength band into an electrical signal;
   an optical waveguide comprising a core member and a clad member and provided on an light incident side of the photoelectric conversion unit, the optical waveguide being configured so that light entering from a first direction is converted into a first waveguide mode and is guided and light entering from a second direction, which is different from the first direction, is converted into a second waveguide mode and is guided; and
   a light blocking member provided in the optical waveguide and formed of a material which is opaque to light in the wavelength band, for reducing more light in the second waveguide mode which is guided to the photoelectric conversion unit than light in the first waveguide mode which is guided to the photoelectric conversion unit, wherein
   the light entering from the first direction is light which passes through a first exit pupil region on a surface of an exit pupil of an optical system for forming a subject image for the solid-state imaging device, and
   the light entering from the second direction is light which passes through a second exit pupil region that is on the surface of the exit pupil of the optical system, said second exit pupil region being symmetrical with the first exit pupil region with respect to a center of the exit pupil.

2. The solid-state imaging device according to claim 1, wherein one of the optical waveguide and the light blocking member is formed so as to be asymmetrical with respect to a central axis of the pixel.

3. The solid-state imaging device according to claim 2, wherein the light blocking member is disposed so as to be asymmetrical with respect to a plane including a central axis of the optical waveguide.

4. The solid-state imaging device according to claim 2, wherein a central axis of the optical waveguide is shifted with respect to the central axis of the pixel; and
   the light blocking member is disposed so as to be symmetrical with respect to a plane including the central axis of the optical waveguide.

5. The solid-state imaging device according to claim 1, wherein the optical waveguide comprises an light incident member which is in a tapered shape so that a diameter thereof becomes larger toward the light incident side, the light incident member being formed in an asymmetrical shape with respect to the plane including the central axis of the optical waveguide.

6. The solid-state imaging device according to claim 1, further comprising a wiring member being arranged closer to the light incident side than the photoelectric conversion unit, wherein
   the light blocking member is made of a material which is the same as a material of the wiring member.

7. The solid-state imaging device according to claim 6, wherein the light blocking member is level with the wiring member.

8. The solid-state imaging device according to claim 1, comprising:
   a first pixel region comprising multiple first pixels, each of the multiple first pixels comprising the light blocking member provided in the optical waveguide thereof; and
   a second pixel region comprising multiple second pixels, each of the multiple second pixels comprising another light blocking member for reducing light in a mode different from a mode of light to be reduced by the light blocking member in the first pixel region, the another light blocking member being provided in the optical waveguide thereof, wherein
   a ranging signal of a subject is output using pixel signals from the first pixel region and the second pixel region.

9. The solid-state imaging device according to claim 1, wherein at least a part of the light blocking member is provided in the core member.

10. A camera comprising an image-forming lens and the solid-state imaging device according to claim 1.

11. The solid-state imaging device according to claim 1, wherein the light blocking member is formed of a metal.

12. The solid-state imaging device according to claim 11, wherein the metal contains at least one of Al and Cu.

13. The solid-state imaging device according to claim 1, wherein the light blocking member is arranged in a region through which light in the second waveguide mode passes and light in the first waveguide mode does not pass.

14. A solid-state imaging device comprising a pixel comprising:
   a photoelectric conversion unit for converting light of a wavelength band into an electrical signal;
   an optical waveguide comprising a core member and a clad member and provided on an light incident side of the photoelectric conversion unit, the optical waveguide being configured so that light entering from a first direction is converted into a first waveguide mode and is guided and light entering from a second direction, which is different from the first direction, is converted into a second waveguide mode and is guided; and
   a light blocking member provided in the optical waveguide and formed of a material which is opaque to light in the wavelength band, for reducing more light in the second waveguide mode which is guided to the photoelectric conversion unit than light in the first waveguide mode which is guided to the photoelectric conversion unit, the solid-state imaging device further comprising:

a first pixel region comprising multiple first pixels, each of the multiple first pixels comprising the light blocking member provided in the optical waveguide thereof; and a second pixel region comprising multiple second pixels, each of the multiple second pixels comprising another light blocking member for reducing light in a mode different from a mode of light to be reduced by the light blocking member in the first pixel region, the another light blocking member being provided in the optical waveguide thereof, wherein a ranging signal of a subject is output using pixel signals from the first pixel region and the second pixel region.

15. The solid-state imaging device according to claim 14, wherein one of the optical waveguide and the light blocking member is formed so as to be asymmetrical with respect to a central axis of the pixel.

16. The solid-state imaging device according to claim 15, wherein the light blocking member is disposed so as to be asymmetrical with respect to a plane including a central axis of the optical waveguide.

17. The solid-state imaging device according to claim 15, wherein a central axis of the optical waveguide is shifted with respect to the central axis of the pixel, and the light blocking member is disposed so as to be symmetrical with respect to a plane including the central axis of the optical waveguide.

18. The solid-state imaging device according to claim 14, further comprising a wiring member being arranged closer to the light incident side than the photoelectric conversion unit, wherein the light blocking member is made of a material which is the same as a material of the wiring member.

19. The solid-state imaging device according to claim 14, wherein the light entering from the first direction is light which passes through a first exit pupil region on a surface of an exit pupil of an optical system for forming a subject image for the solid-state imaging device, and the light entering from the second direction is light which passes through a second exit pupil region that is on the surface of the exit pupil of the optical system, said second exit pupil region being symmetrical with the first exit pupil region with respect to a center of the exit pupil.

20. A camera comprising an image-forming lens and the solid-state imaging device according to claim 14.

* * * * *